United States Patent [19]

Shyu et al.

[11] Patent Number: 5,221,890
[45] Date of Patent: Jun. 22, 1993

[54] REFERENCE GENERATOR

[75] Inventors: Jyn-Bang Shyu, Cupertino; Roubik Gregorian, San Jose, both of Calif.

[73] Assignee: Sierra Semiconductor Corporation, San Jose, Calif.

[21] Appl. No.: 851,924

[22] Filed: Mar. 16, 1992

[51] Int. Cl.⁵ .............................................. G05F 3/16
[52] U.S. Cl. ...................................... 323/317; 341/144
[58] Field of Search ............... 341/194; 323/315, 316, 323/317

[56] References Cited

U.S. PATENT DOCUMENTS

| | | | |
|---|---|---|---|
| 4,384,274 | 5/1983 | Mao | 341/144 |
| 4,638,241 | 1/1987 | Colles | 323/312 |
| 4,689,607 | 8/1987 | Robinson | 343/315 |
| 4,701,694 | 10/1987 | Penney et al. | 323/317 |
| 4,814,688 | 3/1989 | Colles | 323/317 |

*Primary Examiner*—Marc S. Hoff
*Attorney, Agent, or Firm*—Burns, Doane, Swecker & Mathis

[57] ABSTRACT

An apparatus for generating a substantially constant voltage control signal using either one of a voltage reference source and a current reference source includes a transistor device responsive to a supply voltage and the voltage control signal to produce a controlled current, an operational amplifier device for generating the voltage control signal in response to the voltage reference source, and a switching device for generating the voltage control signal in response to the current reference source. When the switching device is in one state thereof, an output signal of the operational amplifier device is connected through the transistor device in a closed loop back to an input terminal of the operational amplifier device. When the switching device is in another state thereof, the output signal of the operational amplifier device is connected directly in the closed loop back to an input terminal of the operational amplifier device. In particular, the switching device may be a single-pole, single-throw switch realized using either a pass gate device or a bonding wire option Circuit complexity is therefore reduced.

8 Claims, 3 Drawing Sheets

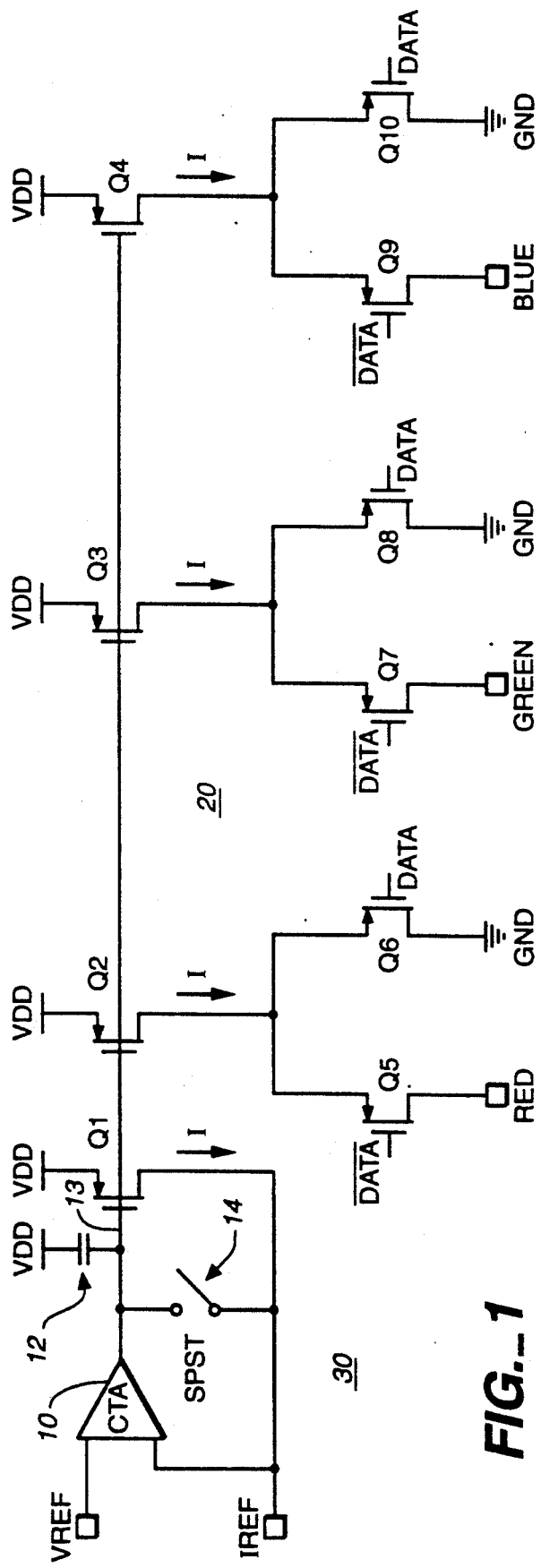
FIG._1

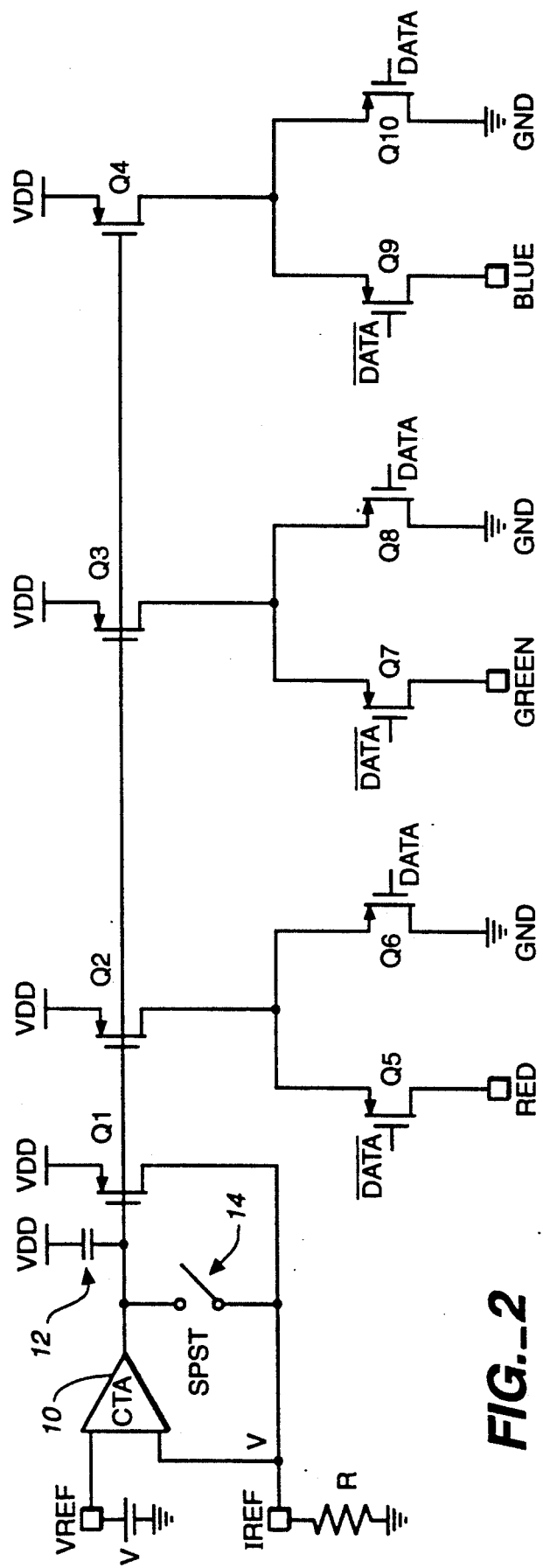
FIG._2

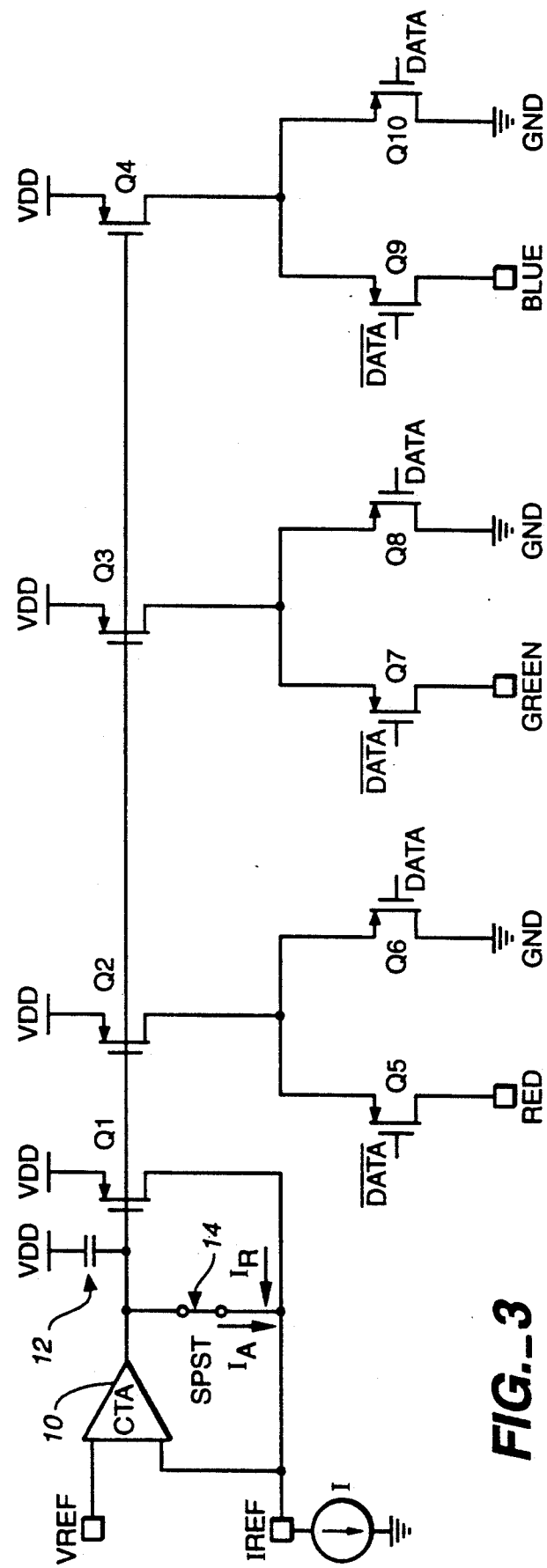
FIG._3

REFERENCE GENERATOR

BACKGROUND OF THE INVENTION

Field of the Invention

The present invention relates to reference generators for use in digital to analog converters and more particularly to a reference generator capable of using a voltage reference source or a current reference source to produce a substantially constant voltage for obtaining a precise conversion of a digital signal to an analog signal. The invention is particularly applicable to converting binary data relating to the primary colors such as red, green and blue into corresponding analog signals.

State of the Art

In computer display systems, display information is represented in computer memory by what may be imagined as a three dimensional array of binary digits. The first two dimensions correspond to the dimensions of the computer display in terms of pixel elements. For example, if the computer display has 640×480 picture elements, these picture elements are represented in computer memory by what may be conceived of as a 640×480 array of binary digits, or bits. For grayscale and color displays, the third dimension of the array of binary digits corresponds to the intensity with which each pixel is to be displayed. For example, if each picture element is to be displayed at one of 256 different possible intensities, then 8 bits are required for each pixel to represent the intensity of that pixel. To display the image on the computer display, a series of 8-bit words each representing the intensity of a single pixel is read out of the computer memory and applied to a digital-to-analog converter to produce a signal of corresponding intensity.

In the case of a color display, each 8-bit word is first applied to a color look-up table stored in random access memory. Contained in the color look-up memory are expanded digital words representing a sub-set of active display colors of a set or palette of possible colors. The expanded digital words are logically divided into three portions, each corresponding to a primary display color such as red, green or blue. Each of these portions of the overall digital word is input to a separate digital-to-analog converter corresponding to a particular primary color to produce analog red, green and blue display signals.

To perform digital-to-analog conversion, an incremental voltage or current is added to a cumulative voltage or current for each possible digital value up to and including the digital value being converted. Of overriding importance is that the incremental voltage or incremental current be substantially constant. To generate the aforementioned incremental voltage or current, digital-to-analog converters require that a reference voltage or reference current be input to the digital-to-analog converter. From a reference voltage or reference current, a reference generator of the digital-to-analog converter then generates the incremental voltage or current. For greatest convenience, a digital to analog converter should be able to accept either a voltage reference input or a current reference input. Users of the digital-to-analog converter are thereby afforded maximum flexibility, and manufacturers of digital-to-analog converters can manufacture a single type of digital-to-analog converter adaptable to both types of use.

U.S. Pat. No. 4,814,688 discloses a reference generator for producing a substantially constant voltage from either a reference current or a reference voltage to energize transistors in a digital-to-analog converter. The circuit of the reference generator requires the use of a single-pole, double-throw switch and is therefore unduly complex.

SUMMARY OF THE INVENTION

According to the present invention, an apparatus for generating a substantially constant voltage control signal using either one of a voltage reference source and a current reference source includes a transistor device responsive to a supply voltage and the voltage control signal to produce a controlled current, an operational amplifier device for generating the voltage control signal in response to the voltage reference source, and a switching device for generating the voltage control signal in response to the current reference source. When the switching device is in one state thereof, an output signal of the operational amplifier device is connected through the transistor device in a closed loop back to an input terminal of the operational amplifier device. When the switching device is in another state thereof, the output signal of the operational amplifier device is connected directly in a closed loop back to an input terminal of the operational amplifier device. In particular, the switching device may be a single-pole, single-throw switch realized using either a pass gate device or a bonding wire option Circuit complexity is therefore reduced.

BRIEF DESCRIPTION OF THE DRAWINGS

The present invention can be further understood with reference to the following description in conjunction with the appended drawings. In the drawings:

FIG. 1 is a circuit diagram showing in part a digital-to-analog converter including the reference generator of the present invention;

FIG. 2 is a circuit diagram showing how a voltage reference source may be used with the circuit of FIG. 1;

FIG. 3 is a circuit diagram showing how a current reference source may be used with the circuit FIG. 1.

DETAILED DESCRIPTION OF THE PREFERRED EMBODIMENTS

Referring to FIG. 1, a digital to analog converter portion 20 of the circuit of FIG. 1 includes a transistor pair Q5 and Q6 for generating a RED signal, a transistor pair Q7 and Q8 for generating a GREEN signal and a transistor pair Q9 and Q10 for generating a BLUE signal. The respective transistor pairs are energized by respective ones of transistors Q2, Q3 and Q4. In the illustrated embodiment, all of transistors Q2-Q10 are P-channel MOSFETs. The sources of transistors Q2, Q3 and Q4 are connected to a supply voltage VDD, and the gates of transistors Q2, Q3, Q4 are connected to a voltage control signal 13 generated by a reference generator portion 30 of the circuit. In response to the voltage control signal 13, each of the transistors Q2, Q3 and Q4 produces a current I that is input to the source of a respective one of the transistor pairs Q5/Q6, Q7/Q8, and Q9/Q10. The drain of one transistor (Q5, Q7 and Q9) of each pair of transistors is connected to an output signal terminal for one of the primary colors, and the gates of the same transistors are connected to the complements of data bits representing the desired intensities of the corresponding primary colors. The drain of the other transistor (Q6, Q8, and Q10) of each of pair of transistors is connected to ground, and the gates of the same transistors are connected to the true form of the data bits. Therefore, when the RED data bit is a 0, the current I is shunt to ground through transistor Q6, and when the RED data bit is a 1, the current I is output to the RED output terminal through the transistor Q5.

For simplicity, only one cell of the digital-to-analog converter is shown for each of the primary colors.

In actual practice, the cells are repeated a number of times equal to the number of possible input values. For example, if 256 digital input values are possible, the cells may be imagined as being stacked 256 deep in a direction into the page. Half of the cells would be controlled in accordance with the most significant data bit, half of the remaining cells would be controlled in accordance with the next most significant data bit, and so forth. For each of the primary colors, the output currents for each of the cells are combined and used to produce a corresponding output voltage at a common output terminal.

Referring more particularly now to the reference generator portion 20 of the circuit of FIG. 1, a P-channel MOSFET Q1 serves as a reference device for each of the transistors Q2, Q3 and Q4. The sources of each of the transistors Q1–Q4 are connected in common to the supply voltage VDD, and the gates of each of the transistors Q1–Q4 are connected in common to the voltage control signal 13. As a result, an identical voltage $V_{GS}$ is applied to each of the transistors Q1–Q4, in response to which each of the transistors Q1–Q4 produces an identical current I, assuming the transistors are the same size. The transistors Q2, Q3 and Q4 therefore act as current mirrors with respect to the transistor Q1. The voltage control signal 13 is produced at the output of an operational transconductance amplifier (OTA) 10. One of the inputs VREF of the OTA 10 is designated for connection to a voltage reference source, and another of the inputs IREF of the OTA 10 is designated for connection to a current reference source.

The drain of the reference MOSFET Q1 is connected to the input terminal IREF, and a single-pole, single-throw switch 14 is connected between the input terminal IREF and the output of the OTA 10. When the switch 14 is in the open position, the output signal of the OTA 10 is connected through the reference MOSFET Q1 in a closed loop back to the input terminal IREF of the OTA 10. When the switch 14 is closed, the output signal of the OTA 10 is connected directly in a closed loop back to the input terminal IREF of the OTA 10. In order to ensure stable operation of the reference generator, a capacitor 12 is connected between the output signal of the OTA 10 and the supply voltage VDD.

Referring to FIG. 2, in order to use the reference generator with a voltage reference source, a voltage source V is connected between the VREF input terminal and ground and a resistor R is connected between the IREF terminal and ground. The switch 14 is set to the open position. The OTA 10 operates to force the input terminal IREF to the same voltage level as the input terminal VREF. Therefore, assuming the voltage source to have a value of V volts, the input terminal IREF will also be driven to V volts, causing a current of V/R amps to be supplied by the reference MOSFET Q1 and to flow through the resistor R. The control voltage produced by the OTA 10 and applied to the gates of the transistors Q1–Q4 will therefore assume the value required to cause the current V/R to flow through the reference MOSFET Q1.

Referring to FIG. 3, to use the reference generator with a current reference source, a current source I is connected between the input terminal IREF and ground, and the switch 14 is closed. The switch may be realized by either a pass gate device or a bonding wire option. In the later case, a user provides a trace on a circuit board designed to receive an integrated circuit realizing the reference generator, the trace creating a short circuit between the IREF input terminal and a pin connected to the output terminal of the OTA 10. The current source causes a current I to flow from the input terminal IREF to ground. The current I is equal to sum of a current $I_R$ that flows through the reference MOSFET Q1 and a current $I_A$ from the output of the OTA 10. The OTA 10, however, is designed to have a very low output current capability, such that $I_A << I_R$. As a result, the voltage control signal produced at the output of the OTA 10 applied to the gates of the transistors Q1–Q4 is very nearly equal to the voltage required by the reference MOSFET Q1 to produce a current I of a magnitude fixed by the current reference source.

As may be appreciated from the foregoing description, the reference generator circuit of FIG. 1 provides a very simple way of generating a substantially constant voltage from either a voltage reference source or a current reference source. In comparison with the prior art, the circuit requires only a single-pole, single-throw switch rather than a single-pole, double-throw switch.

The foregoing has described the principles, preferred embodiments and modes of operation of the present invention, however, the invention should not be construed as limited to the particular embodiments discussed. Instead, the above described embodiment should be regarded as illustrative rather than restrictive, and it should be appreciated that variations may be made in those embodiments by workers skilled in the art without departing from the scope of the present invention as defined by the following claims.

What is claimed is:

1. In a digital to analog converter, an apparatus for generating a voltage control signal using either one of a voltage reference source and a current reference source, comprising:

transistor means responsive to a supply voltage and said voltage control signal to produce a controlled current;

operational amplifier means for generating said voltage control signal in response to said voltage reference source; and switch means for generating said voltage control signal in response to said current reference source, wherein when said switch means is in one state thereof, an output signal of said operational amplifier means is connected through said transistor means in a closed loop back to an input terminal of said operational amplifier means, and when said switch is in another state thereof said output signal of said operational amplifier means is connected directly in a closed loop back to an input terminal of said operational amplifier means.

2. The apparatus of claim 1 wherein said switch means operates as a single-throw, single-pole switch.

3. The apparatus of claim 2 wherein said switch means is a pass gate device.

4. The apparatus of claim 2 wherein said switch means is realized by a bonding wire option.

5. The apparatus of claim 1 wherein said operational amplifier means is an operational transconductance amplifier having a low current output capability as compared to said current reference source and said controlled current.

6. The apparatus of claim 5 wherein said transistor means is a P-channel MOSFET.

7. The apparatus of claim 6 further comprising a plurality of cells each connected to receive said voltage control signal, each cell comprising:

a P-channel MOSFET responsive to said supply voltage and said voltage control signal to generate current substantial equal to said controlled current; and a pair of MOSFETs each connected to receive said current at a source at each of said MOSFETs, one of said MOSFETs operating to shunt said current to circuit ground in accordance with a logic signal applied to a gate of said one of said MOSFETs and another of said MOSFETs operating to channel said current to an output terminal in accordance with an opposite logic signal applied to a gate of said another of s id MOSFETs.

8. The apparatus of claim 6 further comprising a compensating capacitor connected to said output signal of said operational amplifier means.

* * * * *